United States Patent
Kim

(10) Patent No.: US 11,423,951 B2
(45) Date of Patent: Aug. 23, 2022

(54) SEMICONDUCTOR STRUCTURE AND METHOD FOR FABRICATING THE SAME

(71) Applicant: XIA TAI XIN SEMICONDUCTOR (QING DAO) LTD., Qingdao (CN)

(72) Inventor: Il-Goo Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 82 days.

(21) Appl. No.: 16/740,482

(22) Filed: Jan. 12, 2020

(65) Prior Publication Data

US 2021/0217447 A1    Jul. 15, 2021

(51) Int. Cl.
*H01L 27/108* (2006.01)
*G11C 5/06* (2006.01)

(52) U.S. Cl.
CPC ........ *G11C 5/063* (2013.01); *H01L 27/10814* (2013.01); *H01L 27/10823* (2013.01); *H01L 27/10855* (2013.01); *H01L 27/10876* (2013.01)

(58) Field of Classification Search
USPC ........................................................ 257/296
See application file for complete search history.

(56) References Cited

U.S. PATENT DOCUMENTS

| | | | |
|---|---|---|---|
| 10,043,879 B1 | 8/2018 | Kim et al. | |
| 10,050,041 B1 | 8/2018 | Yoon et al. | |
| 10,347,654 B1 * | 7/2019 | Iwai | H01L 27/11519 |
| 2011/0163417 A1 * | 7/2011 | Soss | H01L 28/20 |
| | | | 257/536 |
| 2012/0199938 A1 * | 8/2012 | Hwang | H01L 21/768 |
| | | | 257/506 |
| 2018/0204951 A1 * | 7/2018 | Cheng | H01L 29/42392 |
| 2019/0348435 A1 * | 11/2019 | Nagata | H01L 27/11575 |

FOREIGN PATENT DOCUMENTS

| | | | | |
|---|---|---|---|---|
| CN | 108574003 A | | 9/2018 | |
| CN | 110690193 A | * | 1/2020 | ....... H01L 21/76879 |

OTHER PUBLICATIONS

English translation of Huang. No Date.*

* cited by examiner

*Primary Examiner* — Hrayr A Sayadian
(74) *Attorney, Agent, or Firm* — ScienBiziP, P.C.

(57) ABSTRACT

A semiconductor structure and a method of fabricating the same are disclosed. The semiconductor structure comprises an active region over a substrate defining a top surface and a gate structure embedded in the active region. In a cross section of the active region, the gate structure includes a conductive feature having a first width buried in the active region and reaching a first depth therein; an insulating cap having a second width arranged above the conductive feature in the active region and reaching a second depth therein; and a dielectric liner arranged between the active region and the conductive feature. The first width is smaller than the second width.

8 Claims, 13 Drawing Sheets

SEMICONDUCTOR STRUCTURE AND METHOD FOR FABRICATING THE SAME

FIELD

The present disclosure generally relates to fabrication of semiconductor device, and more particularly pertains to providing control line structure for semiconductor devices such as random dynamic access memory (DRAM) devices.

BACKGROUND

As integrated circuits (IC) are developed, the desire for higher device density and operation speed becomes never-ending quests for those skilled in the art. With increased feature density in the IC device, the allowed critical dimension of various device features drastically shrinks. However, as feature size continues to shrink, challenges from physical limitations such short channel effect and gap-filling issue become apparent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
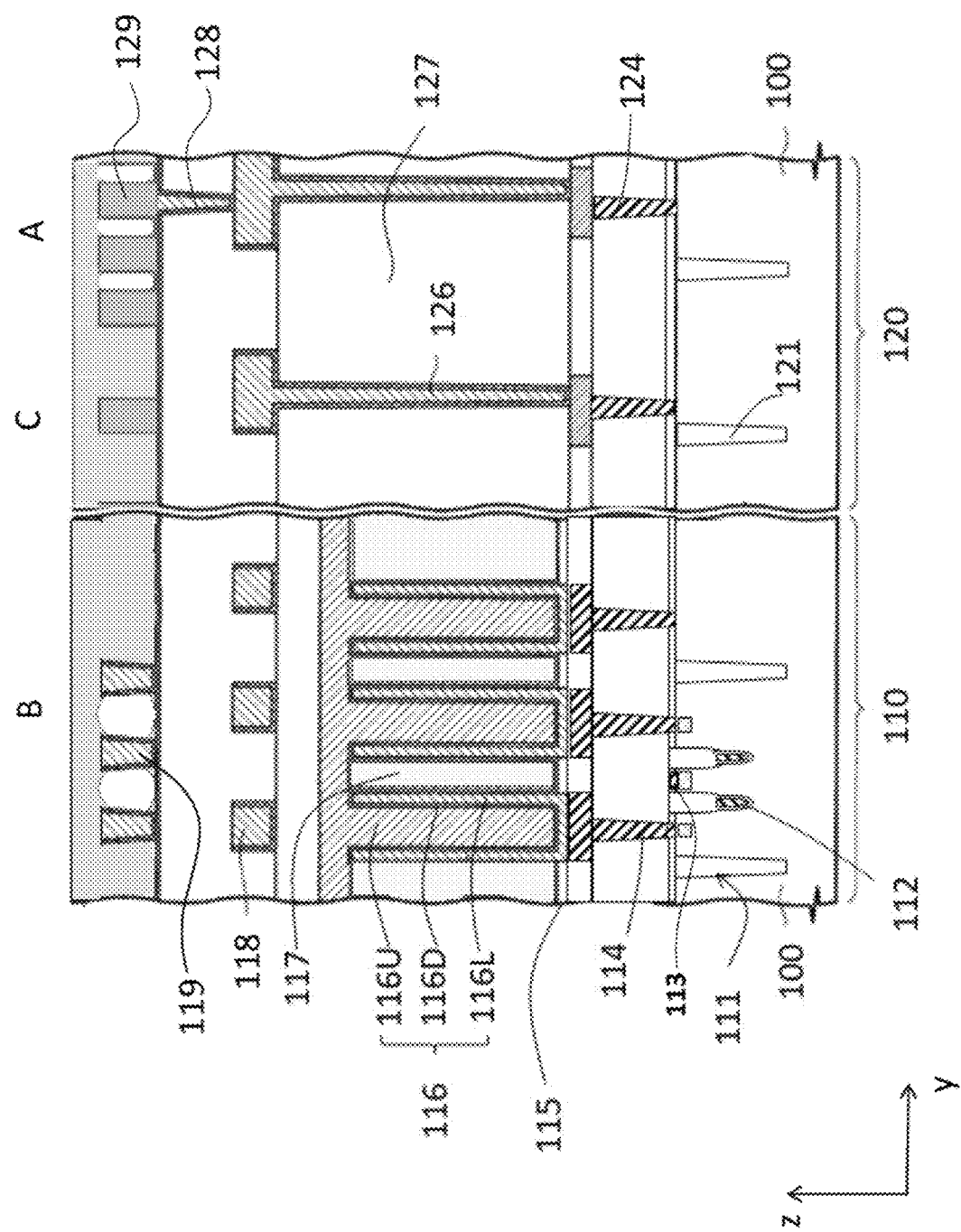
FIG. 1 shows a regional cross section view of a semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout. In addition, reference numerals for comparable elements in different figures may be omitted for simplicity and clarity of illustration.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 5. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 shows a regional cross section view of a semiconductor device in accordance with some embodiments of the instant disclosure. The exemplary device includes a substrate 100 over which multiple layers of integrated circuit devices and features are formed. For illustrational simplicity and clarity, some detail/sub components of the exemplary device are not explicitly labeled in the instant figure.

The substrate 100 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 100 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

Several functional regions may be arranged laterally (e.g., horizontally across the page as shown in FIG. 1) over the substrate. By way of example, FIG. 1 shows a substrate of an exemplary device that includes two co-planar arranged functional regions defined thereon, e.g., a cell region 110 and a periphery region 120. In the illustrated example, the cell region 110 provides space to accommodate active circuit components (e.g., selection transistor 112) and passive circuit components (e.g., storage element, such as capacitor 116) of a DRAM device. Meanwhile, the periphery region 120 houses circuit components for supporting various functions of the DRAM operation, such as read out circuits, decoder circuits, and amplifier circuits. Different functional regions may include circuit components of different critical dimensions based on different design rules. The devices in different functional regions may be designed to function under different operational requirements (e.g., different voltage rage). Devices of different feature dimensions may be arranged on the same plane of a substrate (e.g., circuit chip) to achieve higher degree of integration, hence reduce signal path and enhance device performance.

The cell region may comprise array of memory unit cells. Each of the memory cell units typically includes a bit storage component (e.g., storage capacitor 116) and a selection component (e.g., transistor 112). The unit cells may employ suitable cell architecture, e.g., a 1-T cell format (as shown in the instant example) or other types of cell arrangement (such as a 3T cell layout, not shown). The cell region 110 of the illustrated device are shown to have two gate structures 112 embedded (buried) under a top surface of the substrate 100 in an active area that rests between isolation features 111 (e.g., shallow trench isolation (STI) structure).

Figure 2:
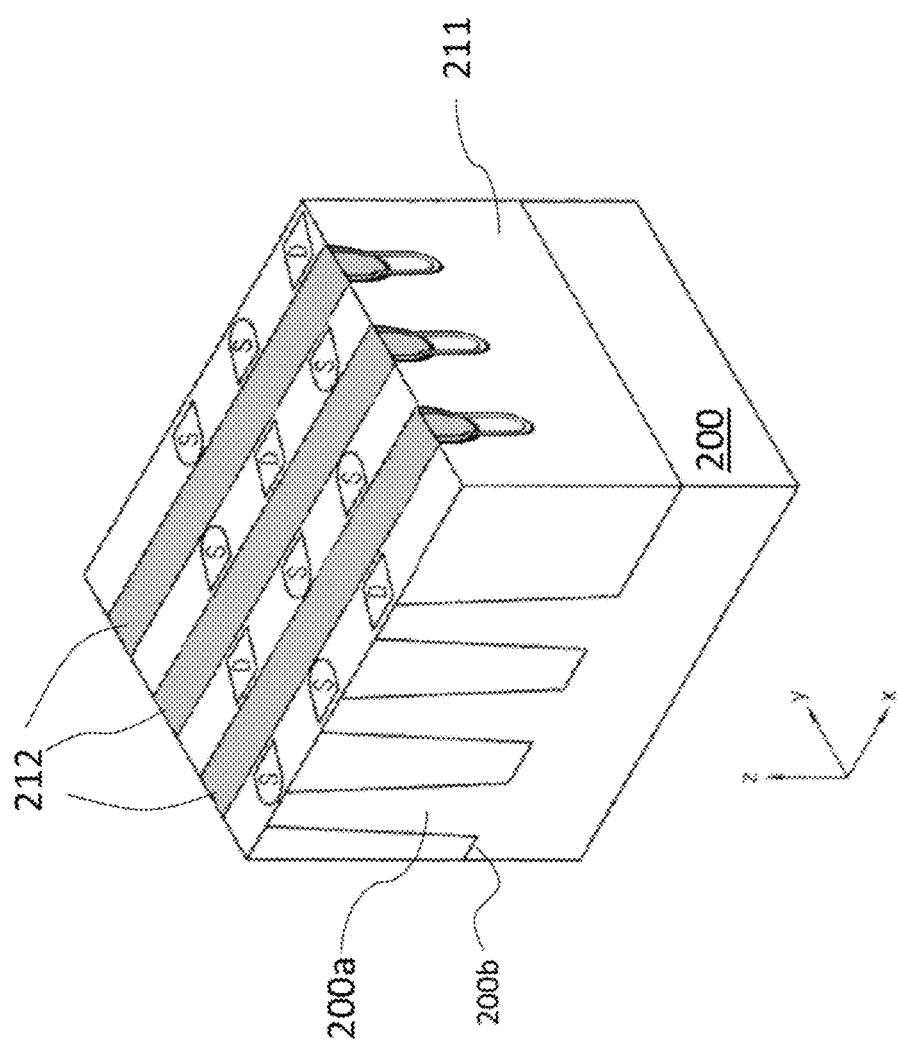
FIG. 2 shows an isometric illustration of an active area arrangement of a semiconductor device in accordance with some embodiments of the instant disclosure.
Figure 3:
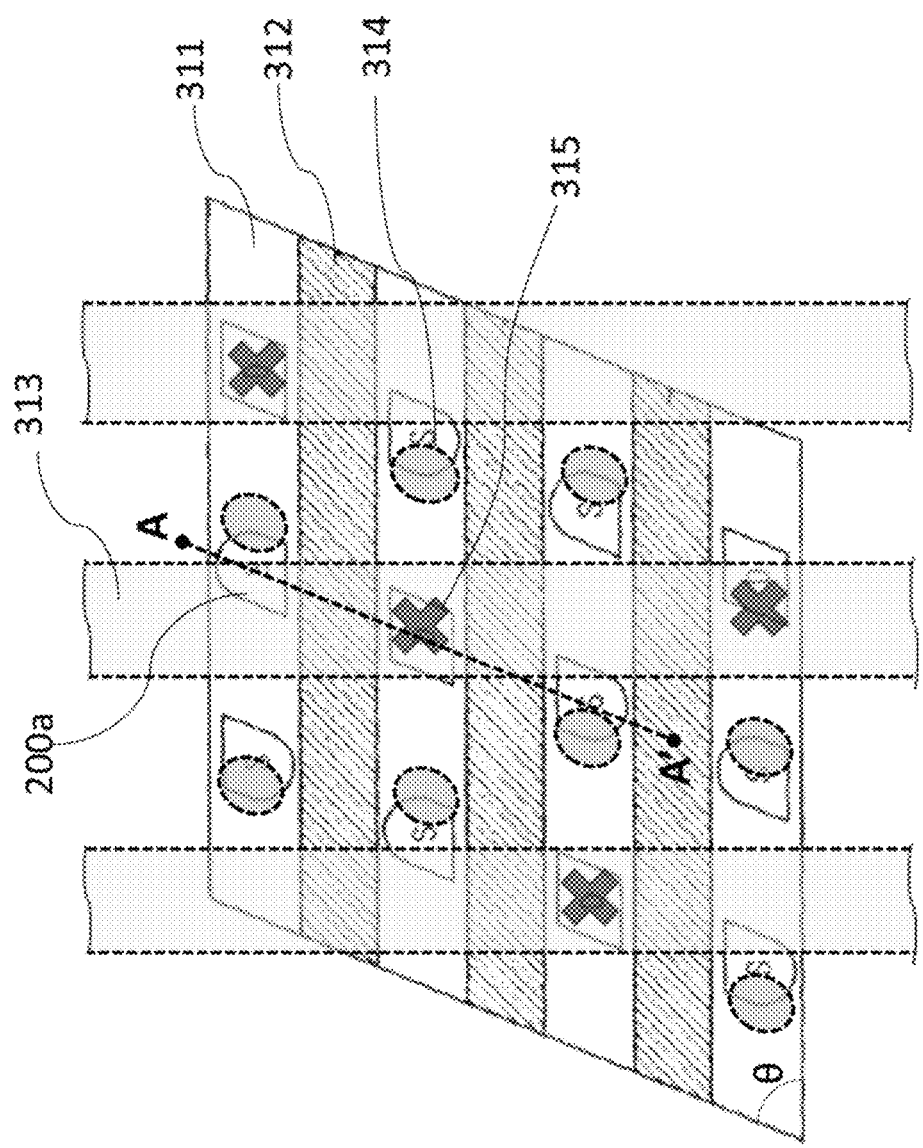
FIG. 3 shows a plane view of an active area arrangement of a semiconductor device in accordance with some embodiments of the instant disclosure.

In some embodiments, the active area (AA) may comprise a raised island structure (with respect to a lower surface of the substrate) having an elongated strip overhead profile and surrounded by isolation structure (e.g., STI 111). In some embodiments, the active area may be obliquely arranged with respect to the traversing direction of a word line (e.g., the extending direction of the gate structure 112) at a slanting angle. For example, as shown in FIG. 2 and FIG. 3, the illustrated portion of an exemplary substrate 200 shows three raised fin-like features (e.g., raised portion 200a) extending away from an lower active surface 200b (e.g., x-y plane) along a vertical direction (e.g., z-axis). Depending on critical dimension scale, in some embodiments, the lower surface 200b of the substrate 200 may not be as flat as schematically illustrated in the instant figure. For instance, in some embodiments where active area spacing is small, the lower surface of the substrate may possess a parabolic profile.

In the illustrated embodiment, the plurality of active areas (e.g., 200a) are surrounded by dielectric material (e.g., STI 211). In some embodiments, each of the active areas 200a has an elongated profile that defines a long axis (e.g., A-A') and is obliquely arranged with respect to the x/y-axis. The oblique arrangement of the active areas in a folded/offset layout may allow more unit cells to be packed in a same area while maintaining sufficient distance there-between, thus achieving higher device density while reducing inter-cell interference (e.g., cross talk).

The gate structure 112 may be part of a memory cell selection device, such as a buried channel array transistor (BCAT). In the illustrated example, the active area (defined between a pair of isolation features 111) has a pair of gate structures 112 embedded at a lower portion thereof. The embedding gate structure 112 and the semiconductor region of the active area cooperatively define a pair of BCATs (whose respective source/drain (S/D) regions being connected to a contact plug, e.g., contact plug/via 114). The contact plug 114 enables electrical connection between the selection transistor (e.g., BCAT) to a lower electrode (e.g., 116L) of a storage capacitor 116 (e.g., through a pad not specifically labeled).

The gate structure 112 of an exemplary buried type device may comprise a embedded structure (in a cross sectional profile) disposed/filling in a gate trench in the active area. In DRAM applications, the gate structure 112 may be a laterally traversing linear structure (e.g., as shown in FIG. 2 and FIG. 3) that intercepts multiple adjacent active areas (and serves as a word line (WL) for a memory device).

In the quest to pursue the ever-shrinking device form factor, buried type transistor as selection device becomes a suitable candidate thanks to its extended channel length (e.g., from a S/D region under a contact plug 114 vertically down to the bottom tip of the gate structure 112, then laterally across the tip of to the buried gate electrode and back up to the opposite S/D region under a neighboring contact plug), which enables higher device density while alleviating the accompanied short channel effect. However, as feature size continues to shrink, gap-filling operation for the embedded buried gate structure becomes a challenge. By way of example, as the aspect ratio of the gate trench that crosses through the active area(s) increases, difficulties in disposing conductive material into the gate trench for forming gate electrode also increases. Moreover, as device features continue to reduce, creative channel extension schemes may be helpful to further optimize of transistor performance and ensure enhanced short-channel alleviation.

In the illustrated embodiment, the gate structure 112 comprises a gate electrode (not labeled) embedded at a lower portion of the gate trench (e.g., partially filling) in the active area. The gate electrode may include one or more conductive material such as doped polysilicon, or metal material such as tungsten, ruthenium, and cobalt. The gate structure 112 also comprises a gate insulation liner that lines the bottom portion of the trench, and is arranged between the gate electrode and the semiconductor material of the active area. The gate insulation liner may be a conformally formed insulating layer covering an inner side wall of the gate trench. The gate dielectric liner may be made of insulating material such as silicon oxide, silicon nitride, silicon oxynitride, or a metal oxide. The metal oxide may include, for example, hafnium oxide, aluminum oxide, or titanium oxide. High-K dielectric materials may be utilized to complement metal based gate electrodes for enhancing the performance of a field effect transistor. In some embodiments, the gate structure 112 may further comprise a barrier liner conformally disposed between the gate dielectric liner and the gate electrode. The gate barrier liner may comprise a barrier metal compound, such as, tungsten nitride (WN), titanium nitride (TiN) or tantalum nitride (TaN).

In the illustrated embodiment, a shared S/D region is defined between the pair of neighboring gate structures 112 in the active area (between STI structures 111. In some embodiments, bit line 113 is arranged over the shared S/D region formed between the gate structures 112 at a central region of the active area (between STI structures 111). The bit line 113 may be a linear conductive structure that extends in/out of the page as shown in the instant illustration, and electrically connects a plurality of S/D regions at the respective central region of multiple active areas (e.g., the respective S/D region of a plurality of active areas arranged in a roll; not shown in the instant regional cross section view).

The contact plug 114 may be formed in and through a dielectric layer (e.g., interlayer dielectric, ILD) above the active area, thereby establishing a vertical conductive path from the surface of the substrate 100 to upper layers of the device stack over the active area. In some embodiments, the contact plug 114 may serve as a storage node via/plug that enables vertical electrical connection with a lower electrode of a storage element (e.g., electrode 116L of the capacitor element 116). The dielectric layer may be made of materials such as oxide or nitride of silicon. In some embodiments, the dielectric layer may include low-K material having dielectric constant lower than, e.g., 3.9. The contact plug 114 may be made of one or more metal or non-metal conductive material, such as poly-silicon, tungsten, aluminum, etc.

Storage element (such as storage capacitor 116) may be formed over the contact plug 114 (e.g., above the corresponding contact pad over the plug) in a dielectric layer 117. The storage capacitor 116 comprises lower electrode 116L, upper electrode 116U, and capacitor dielectric 116D arranged between the upper and the lower electrodes.

A separation layer (e.g., layer 115) may be provided over the contact plug 114, through which the lower electrode of the storage capacitor 116 (e.g., bottom electrode 116L) is formed to establish electrical connection with the contact plug 14. The separation layer may comprise nitride material, e.g., silicon nitride, and serve as etch stop during the fabrication process of the capacitor structure. It is noted that the term "lower" electrode is made with respect to the surface of the substrate for the ease of referral, and shall not be construed as an undue limitation as to device orientation. The contact plug 114 provides a vertical conduction path between the source/drain region of the selection device (e.g., transistor 112) and the lower electrode of the storage element (e.g., electrode 116L).

In some embodiments, the lower electrode 116L may be a cylindrical conductive structure having high aspect ratio (i.e., high depth to width ratio), which corresponds to a tall upward opening U-shaped cross sectional profile (as shown the instant example). In some embodiments, a lateral width of the conductive structure may be few tens of nanometer in scale, e.g., having critical dimension of about 40 nm. In some embodiments, the aspect ratio of the lower electrode 116L may range from about 10 to 40. The lower electrode 116L may be formed from a conformal conductive film made of one or more conductive material(s) such as poly-silicon, SiGe, BSRO ((Ba,Sr)RuO3), CRO (CaRuO3), LSCo ((La,Sr)CoO3), TiN, TiAlN, TaN, TaAlN, W, WN, Ru, RuO2, SrRuO3, Ir, IrO2, Pt, PtO, SRO (SrRuO3).

The capacitor dielectric 116D may be a conformally formed layer that comprises a nitride, an oxide, a metal oxide, or a combination thereof. For example, the capacitor dielectric 116D may include a single or a multilayered film formed from silicon nitride, silicon oxide, a metal oxide (e.g., $HfO_2$, $ZrO_2$, $Al_2O_3$, $La_2O_3$, $Ta_2O_3$, and $TiO_2$), a perovskite dielectric material (e.g., STO ($SrTiO_3$), BST ($(Ba,Sr)TiO_3$), $BaTiO_3$, PZT, and PLZT, or a combination thereof. In some embodiments, high-K dielectric material may be applied to boost capacitor performance, e.g., enhance capacitance for a given electrode surface area.

The upper electrode 116U may be formed of one or more conductive material such as doped semiconductor, conductive metal nitride, metal, metal silicide, conductive oxide, or a combination thereof. For instance, the upper electrode 116U may be formed of conducive material(s) including BSRO ((Ba,Sr)RuO3), CRO (CaRuO3), LSCo ((La,Sr)CoO3), TiN, TiAlN, TaN, TaAlN, W, WN, Ru, RuO2, SrRuO3, Ir, IrO2, Pt, PtO, SRO (SrRuO3), though the list of suitable material is merely exemplary and not exhaustive.

Additional conductive features, such as interconnect features 118 and 119 may be formed in additional inter metal dielectric layers over the upper electrode 116U to enable interconnection between circuit elements. The illustrated embodiment schematically shows three regions of varying feature densities: a highly dense region A having small feature separations; a moderate density region B with larger feature spacing, and a low feature density region C with isolated feature patterns.

As the level of device integration increases, feature density also increases. By way of example, the feature density among the interconnect features (e.g., planar interconnect components such as features 118/119/129, or vertical interconnect components such as features 114/124/126/128) is increased considerably in modern semiconductor devices compared to their preceding counterparts. As such, not only the feature dimension thereof shrinks, the inter-feature distance/separation is also reduced. Densely aggregated interconnect patterns in an inter metal dielectric layer may lead to adverse cross talk or parasitic effects.

In some embodiments, voids (e.g., air gaps) may be incorporated between interconnect features to alleviate the above-mentioned undesirable effects. As air has very low dielectric constant (of about 1.00000), voids in a structure can provide an equivalent dielectric constant of as low as about 1.00059. Thus, the dielectric constant of a porous structure may be significantly lower than a conventional inter metal dielectrics. In the instant embodiment, air gaps are generated between adjacent conductive features in regions A and B to provide reduced regional dielectric constant. In general, under permissible process circumstance(s), maximized air gap size and uniform air gap profile (e.g., identical width and height of voids) may provide enhanced result in cross talk reduction.

The isolated features in region C, on the other hand, may not need further reduction of local dielectric constant due to its isolated nature. It is to be noted that, the term "air gap" generally refers to the absence of material filling in a particular region (thereby forming a structure with void), and does not necessarily imply the gaseous content therein. In some embodiments, the voids between interconnect features may be substantially filed with one or more inert gas such as gaseous argon or nitrogen. In some embodiments, the voids (air gaps) between the interconnect features may be substantially vacuum.

The periphery region 120 may comprise various active device regions laterally separated by isolation features, such as STI 121. The active area may comprise active circuit components (such as transistors) that make up the periphery support circuits, e.g., read-out, decoder, or amplifier circuits. Over the active area there may be upper inter device layers, such as dielectric layer 127, through which contact via/plug 124 may be provided to enable vertical signal conduction from the surface of the substrate 100 to a higher device layer. The contact plug 124 may be connected to a corresponding contact pad (not specifically labeled) there-above in a fashion similar to that in the cell region 110.

Over the contact plug 124 of the presently illustrated embodiment is a dielectric layer 127, through which one or more high aspect ratio interconnect features (e.g., contact via 126) are formed. In some embodiments, the aspect ratio of the contact via 126 may have a range from about 10 to 40. In some embodiments, the dielectric layer 127 may be (at least partially) an lateral extension of the dielectric layer 117 from the cell region 110. In some embodiments, the design rules for the devices in periphery region 120 may assume a greater feature sizes than that in the cell region 110. In some embodiments, the active circuit components in the periphery region 120 are designed to operate at a higher voltage level than those in the cell region 110.

The high aspect ratio features in both the cell region 110 and the periphery region 120 are typically formed through a top-down fashion, such as etching. The etching of high aspect ratio features often takes place through one or more relatively thick device layer (e.g., interlayer dielectric 117 and 127). In some embodiments, special process arrangement and technique could be utilized to generate high aspect ratio feature having lateral/sidewall profile that is substantially normal (vertically perpendicular) with respect to a major surface of the substrate.

Referring again to FIG. 2 and FIG. 3. FIG. 2 shows an isometric illustration of an active area arrangement of a semiconductor device in accordance with some embodiments of the instant disclosure. FIG. 3 shows a plane view of an active area arrangement of a semiconductor device in accordance with some embodiments of the instant disclosure.

In the illustrated cut-away view, the shown portion of the substrate 200 defines a lower surface (e.g., 200b) and a plurality columns (e.g., 3 columns in the shown example) of fin-like features (e.g., 200a) protruding from the lower substrate surface 200b generally along the z-axis direction. The fin-like features 200a embedded in (and surrounded by) insulating material (e.g., 211/311) may be made from semiconductor material, e.g., through either top-down method such as etching or bottom-up method such as epitaxial formation.

In the illustrated embodiment, the rounded planar contour of the active area (e.g., the regions with "S" labels) on the exposed x-y plane represents the terminal portions of one of many active areas arranged in a column. By way of example, the illustrated portion in FIG. 2 shows three columns of active areas extending abreast one another. Moreover, each column comprises two rows of active areas arranged in a laterally off-set configuration. For instance, as shown in FIGS. 2 and 3, an active area from each column of the fin-like features possess a strip profile that spans from a "S" region, a first control line intercepted region (e.g., by a control line 212), a "D" region, a second control line intercepted region, and terminates at a second "S" region. In addition, the laterally off-set configuration may be observed by the arrangement where a "S" region of an active area is laterally aligned (e.g., in the x-direction) with a "D" region of a neighboring active area from an adjacent column.

Each of the control line structures 212 (shown in the instant example to be extending along the x-axis direction) may be a shared gate line structure that intercepts multiple rows of active areas. The control line structure 212 may serve as a word line for a memory device. As shown in FIGS. 2 and 3, each active area 200a is intercepted by two control line structures 212. The two intercepting control lines 212 crossing an active area correspond to the gates of a pair of BCATs, where the region between the control lines 212 defines a shared drain area "D" while the rounded end portions of the active area respectively define the source regions "S" for the transistors. In the illustrated example, each of the active areas (e.g., 200a) defines a longitudinal axis (e.g., A-A') that is obliquely arranged at a slanting angle (e.g., angle θ) with respect to the x-axis.

In the overhead layout illustration of FIG. 3, a plurality of bit lines 313 that extend along the y-direction are arranged over the active areas 200a and projectively crossing a center region thereof (e.g., the "D" region between a pair of intercepting control lines 212). In the instant embodiment, a bit line contact (e.g., contact 315 as indicated by the shaded cross) is provided between the center "D" region of an active area 200a and the bit line 131 to establish electrical connection there-between. On the other hand, the oblique arrangement of the active area 200a allows the "S" regions at the respective ends thereof to projectively offset the bit-line coverage (i.e., allowing the "S" regions of an active area 200a to be at least partially exposed from the planar coverage of a crossing bit line 313), thereby allowing a storage node contact (e.g., contact 314) to be formed at planar locations between the grid-like pattern formed by the projectively intercepting control lines 312 and the bit lines 313 without shorting. A storage element (e.g., storage capacitor 116 as shown in FIG. 1) may then be formed over the storage node contact 314. In some embodiments where a bit line width of about 20 nm is employed, the slanting angle θ may be set at arrange of about 65 to 75 degrees. In some embodiments, the slanting angle θ may be arranged at about 69 degrees (with respect to the x-axis). Accordingly, a compact layout that enables higher feature density may be achieved while maintaining sufficient device separation to keep interference issue within acceptable level.

Figure 4:
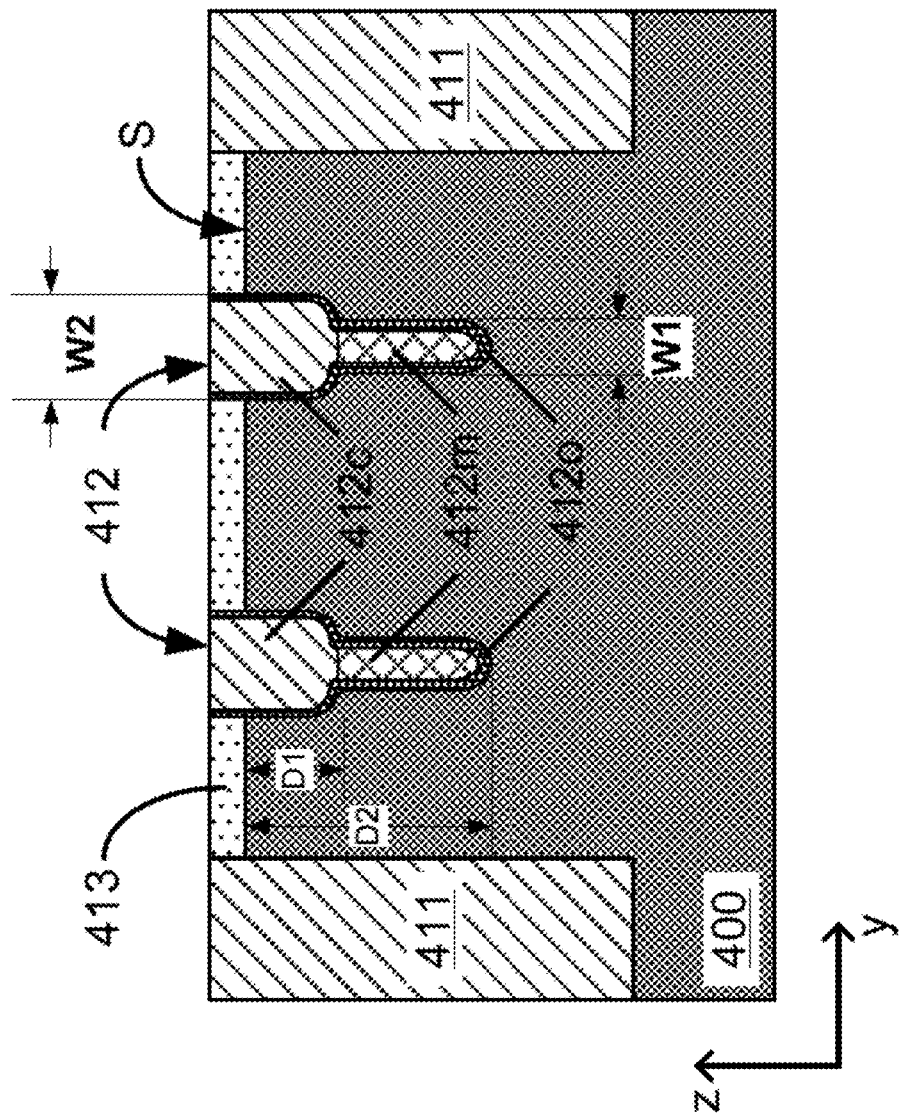
FIG. 4 shows a schematic cross sectional view of an active area in accordance with some embodiments of the instant disclosure.

FIG. 4 shows a schematic cross sectional view of an active area in accordance with some embodiments of the instant disclosure. The illustrated sectional view may be a cross section taken from line A-A' (as shown in FIG. 3) in a plane that is normal to the x-y plane. The illustrated structure may be part of a semiconductor device, e.g., a switching unit that controls the operation of a memory device. The semiconductor device may comprise, among other things, an active region 400a over a substrate 400. In the instant sectional view, the illustrated portion of the active region 400a is situated between isolation structures 411.

The active region 400a defines a top boundary (e.g., surface S). In some embodiments, the active region 400a formed over the active surface of the substrate 400 comprises a stripe planar profile (as exemplified in FIG. 2).

In the exemplary cross sectional view, a pair of gate structures 412 can be seen embedded in the active region 400a. The gate structure 412 comprises a conductive feature 412m that defines a first width W1 is buried in the active region 400a and reaching a first depth D1 therein (e.g., from the upper surface S toward the root of the active region 400a proximate the active surface of the substrate 400). An insulating cap 412c that defines a second width W2 is arranged above the conductive feature 412m in the active region and reaching a second depth D2 therein. In addition, an dielectric liner 412o is arranged between the active region 400a and the conductive feature 412m. In some embodiments, e.g., in memory applications (such as DRAM), the gate structure 412 may be a control line structure that intercepts the active region at an oblique angle. In such applications, the dielectric liner 412o interposes between the control line structure and the active region 400a and serves as gate dielectric layer for the buried type-field effect transistor.

Depending on the applied etching techniques and the process conditions, in some embodiments, the overall width of the embedded features (e.g., insulating cap 412c/conductive feature 412m) may not be uniform along the vertical direction (i.e., the z-axis). In some embodiments, the embedded features may possess a gradually tapered profile (with gradually reduced width toward the root of the active region 400a). In some embodiments, the insulating cap 412c is provided with substantially greater width than the that of the conductive feature 412m.

In some embodiments, the insulating cap 412c defines a shoulder portion proximate the conductive feature 412m. In some embodiments, the conductive feature 412m is arranged not higher than the shoulder portion of the insulating cap 412c. For instance, in some embodiments, a curved sidewall boundary having gradually and continuously reduced width is formed proximate the interface region between the wider insulating cap 412c and the narrower conductive feature 412m. In some embodiments, the shoulder portion of the insulating cap 412c possesses a sloped profile with reduced width toward the conductive feature along the z-axis. The border between the insulating cap 412c and the conductive feature 412m is generally situated below the sloped portion of the insulating cap 412c.

In some embodiments, the dielectric liner 412o extends further upward (i.e., in the direction along the z-axis) beyond the material interface proximate the shoulder portion. In some embodiments, the dielectric liner 412o substantially covers the sidewall of the insulating cap 412c and reaches the top boundary S of the active region. In some embodiments, the upper edge of the dielectric liner 412o may be substantially coplanar with the upper boundary of the insulating cap 412c.

In some embodiments, a ratio of the second depth (D2) to the first depth (D1) ranges from about 0.25 to about 0.67. In some embodiments, a ratio of the first width W1 to the second width W2 ranges from about 0.5 to 0.9. In some embodiments, the portion of the dielectric liner between the insulating cap and the active region has a lower thickness than the portion between the conductive feature and the active region.

Figure 5:
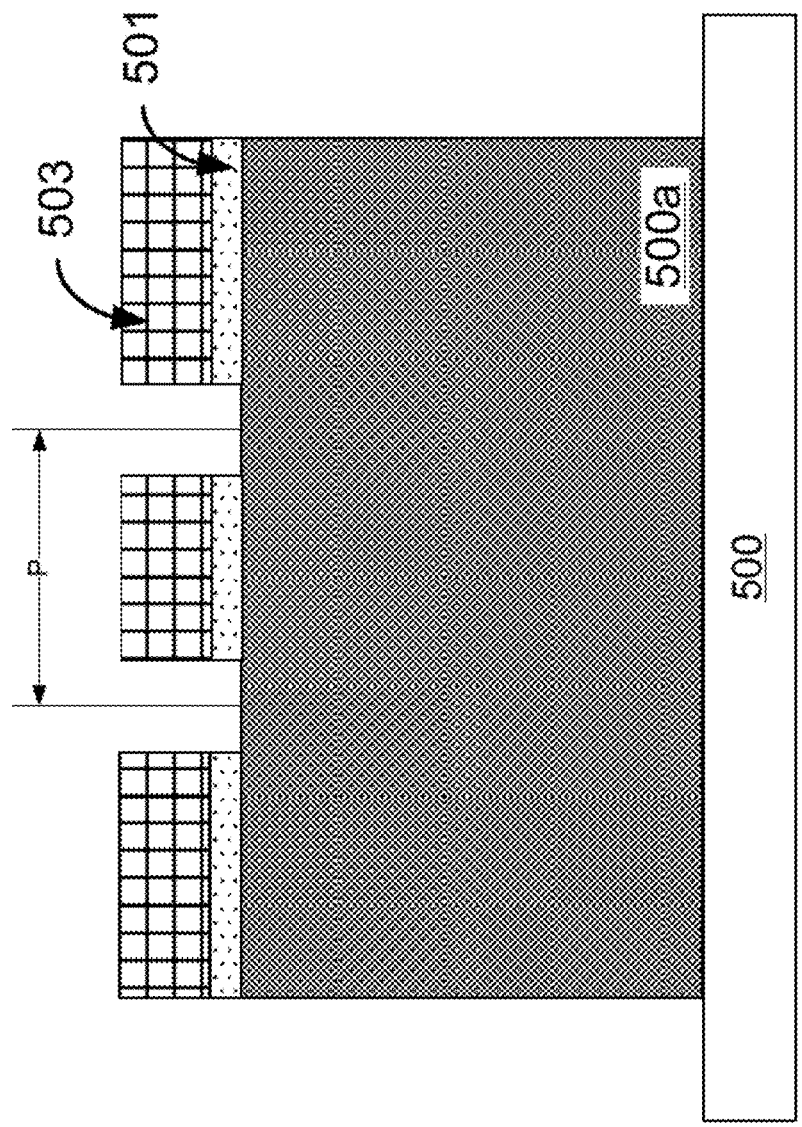
FIGS. 5-13 show intermediate structures during various stages of fabrication processes in accordance with some embodiments of the instant disclosure.

FIGS. 5-13 show intermediate structures during various stages of fabrication processes in accordance with some embodiments of the instant disclosure. For example, the illustrated figures shows a method for fabricating a semiconductor structure in accordance with the instant disclosure. Referring to FIG. 5, one or more active region 500a having a raised fin-like structure is formed over the surface of a substrate 500. the active region 500a may have a generally strip planar profile in an overhead view (e.g., comparable to that shown and depicted in FIGS. 2 and 3).

As shown in FIG. 5, mask patterns are provided over the active region 500a on the substrate 500 in preparation to a subsequent first etching operation. In some embodiments, the active region 500a comprises essentially silicon material. In some embodiments, the mask pattern is a composite hard mask that comprises a first sub-layer 501 and a second sub-layer 503. In some embodiments, the first sub-layer 501 comprises oxide material, such as silicon oxide. On the other hand, the second sub-layer 503 may be form from spin on carbon (SOC) material, amorphous carbon layer (ACL), amorphous silicon, or a combination thereof. In the illustrated embodiment, the mask pattern defines a pair of openings for generating two recess in the active region 500a that are laterally spaced apart by a general pitch distance P (e.g., lateral distance substantially between the respective centers of the openings).

Figure 6:
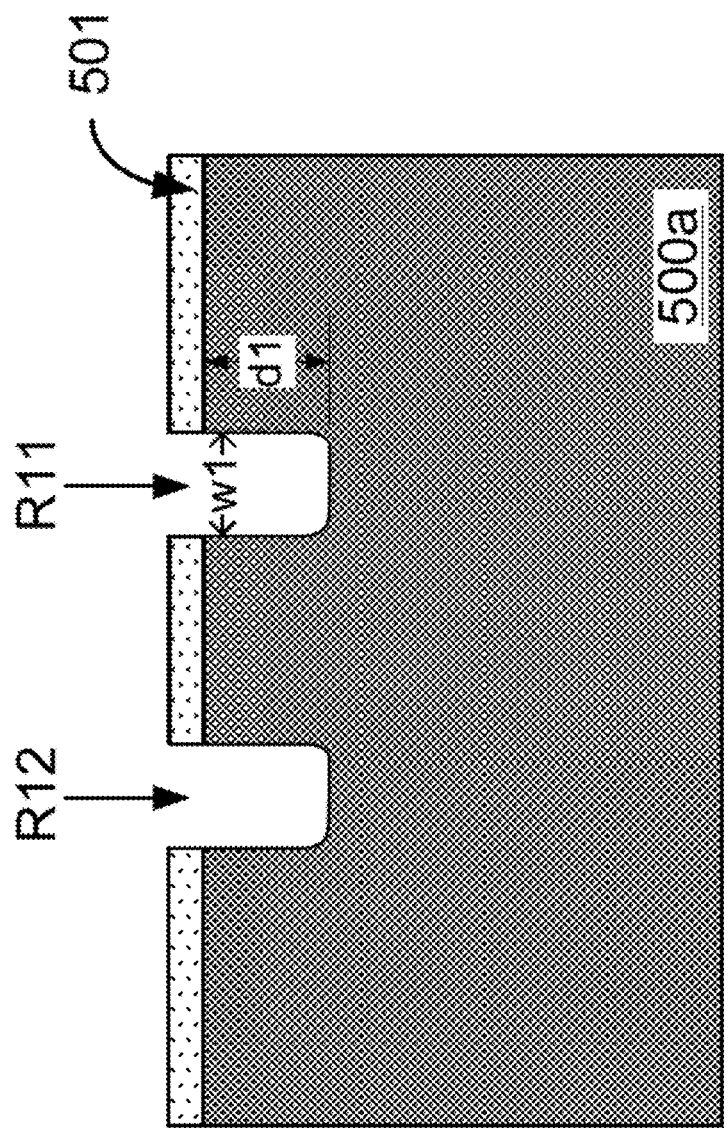

FIG. 6 shows an exemplary result of a partial gate trench etch process through a mask pattern over the active region 500a. For instance, a first etching operation is performed to form a first recessed feature (e.g., recess R11/R12) having a first width w1. The first recess R11 extends downward and intercepts the active region 500a, reaching a first depth d1. The first etching operation may comprise an in-situ STI oxide (or SiN)/active Si etching by F-based gases such as CF4, CHF3, CH2F2, mixed with Cl2, or HBr gases for non-selective oxide-Si, or SiN—Si, or oxide-SiN—Si trench etch.

Subsequently, the upper hard mask sub-layer (e.g., layer 503) is stripped. In some embodiments, carbon-based material of the upper hard mask layer is removed by O2 based plasma by O2 based plasma mixed with N2, H2, etc in preparation for a subsequent liner deposition process. In some embodiments, e.g., in the case where Si based is used for the upper mask layer, there would be no need for prior removal since the silicon material may be removed in a following second etching process. In some embodiments, the organic-based sub-layer in the composite hark mask may be kept without additional striping process prior to subsequent liner deposition (since it may be removed in a final trench etch at a later stage without interfering with liner deposition).

Figure 7:
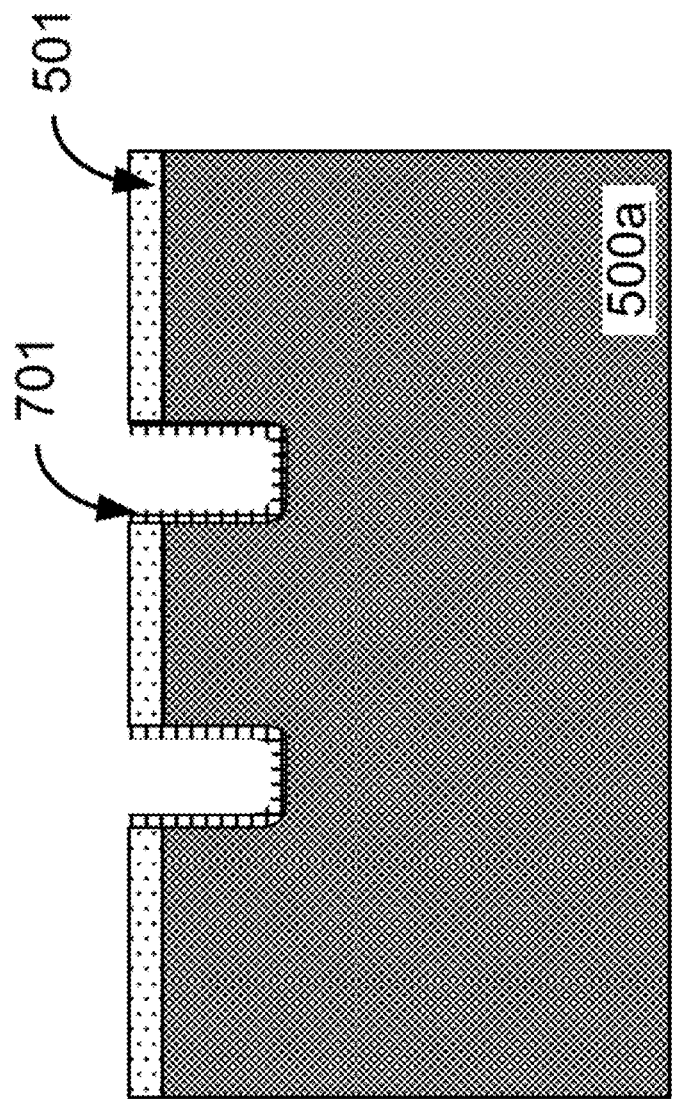

FIG. 7 shows a liner deposition process, in which trench liner 701 is formed substantially conformally over the exposed lateral and bottom surfaces of the first recessed feature (e.g., R11/R12). In some embodiments, a trench liner 701 is formed by chemical vapor deposition or atomic layer deposition technique. The trench liner 701 may be form of one or more dielectric material, such as oxide and nitride of the substrate material. In some embodiments where the upper hard mask layer (e.g., layer 503) and the surrounding isolation structure (e.g., STI 411 as shown in previously embodiments) are made of oxide material such as SiO2, the trench liner 701 may be made of nitride based material such as SiN. In some embodiments where the upper hard mask layer is made from nitride based material such as SiN, SiCN, etc., the trench liner 701 may be made of oxide material for selectivity control in process integration.

Figure 8:
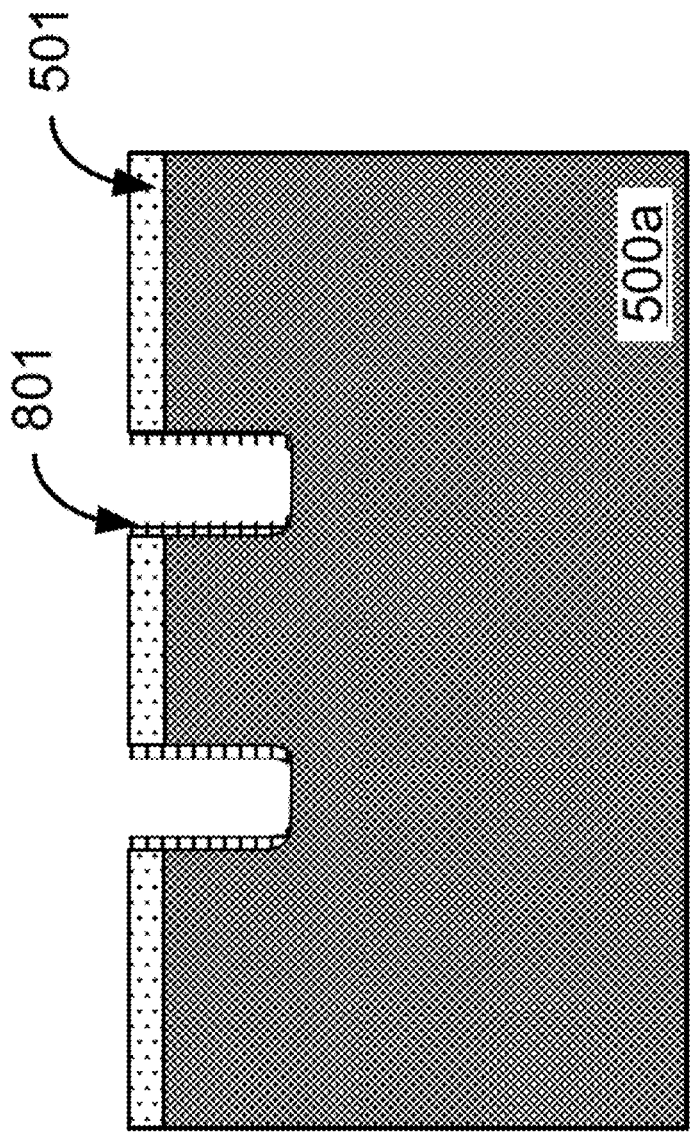

FIG. 8 shows a liner etch back and spacer formation process. In some embodiments, an anisotropic etch is performed against the bottom portion of the trench liner 701, leaving the lateral coverage of the liner 701 on the recess sidewall to form the liner spacer 801. The liner etch back process may employ F-based chemistry, such as NF3, SF6, CF4, CHF3, CH2F2, CH3F, or their combination, in a dry etching process.

Figure 9:
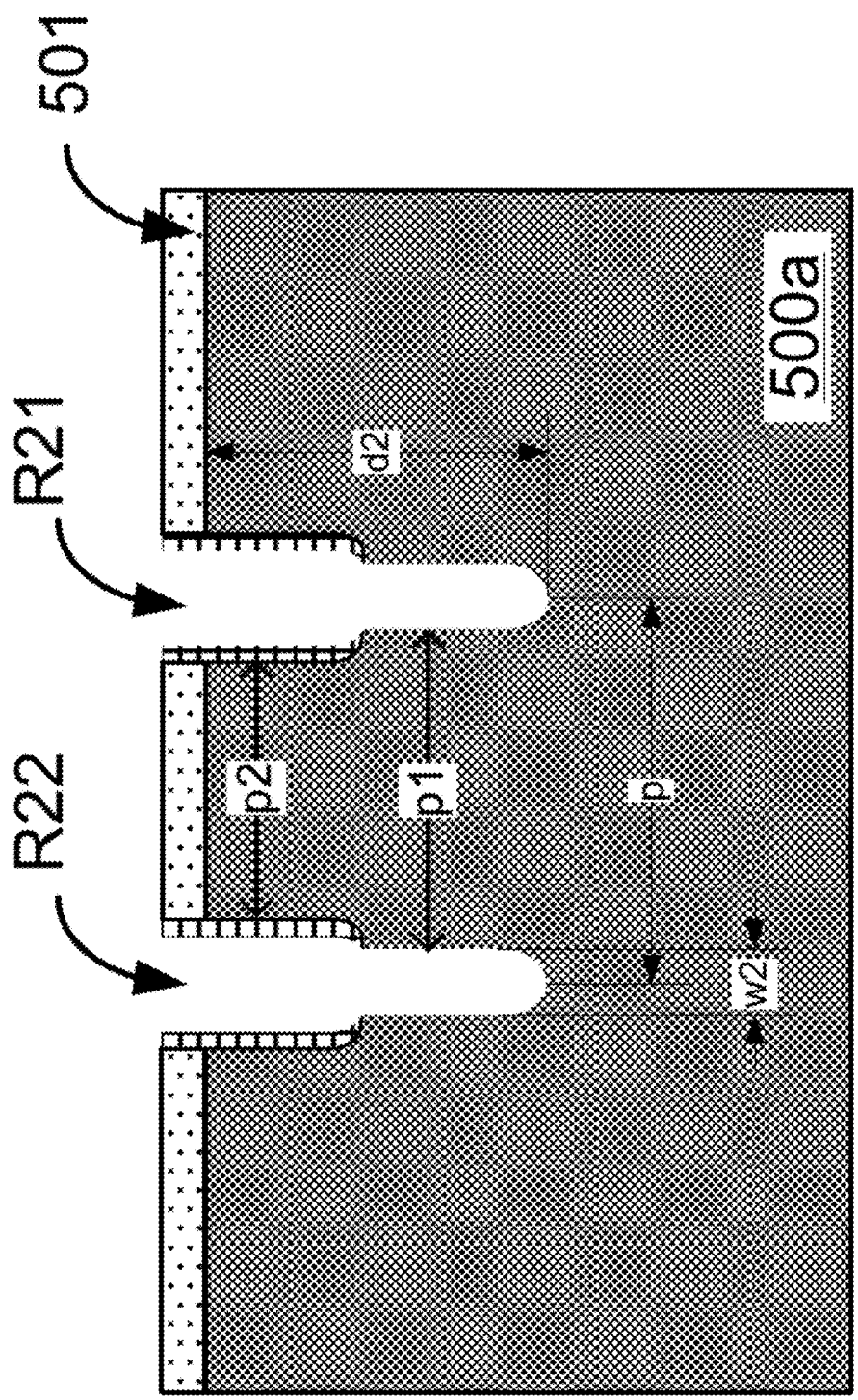

FIG. 9 shows a lower gate trench etch process, in which the liner spacer 801 is used as an self-aligned etch mask to generate the lower portion of the gate trench feature. For instance, a second etching operation is performed through the portion of the liner on the bottom surface while retaining the portion of the liner over the lateral surface of the first recessed feature (e.g., spacer 801) to form a second recessed feature. Accordingly, a lower portion of the gate trench (e.g., recess R21/R22) having a second width w2 and reaching a second depth d2 in the active region 500a may be formed. As shown in the instant figure, pitch p denotes the average separation pitch between two neighboring gate recess features (e.g., R21, R22) in an active region 500a; pitch p1 denotes an average separation between respective lower recess portions of the neighboring gate trenches; and pitch p2 denotes an average separation between the upper portions of the respective gate trench features. Because of the employment of spacer liner 801, the pitch separation of p>p1>p2 may be generated.

In some embodiments, the second etching operation may employ etch chemistry comparable to that used in the first etching operation for non-selective Si-Oxide, or Si—SiN, or Si-Oxide-SiN removal. In some embodiments, F-based chemistry, such as NF3, SF6, CF4, CHF3, CH2F2, CH3F, or their combination, may be used as etchant for STI, field nitride, or oxide recess process. In some embodiments, the partial gate trench etch, upper hard mask strip, the liner etch back, and the lower trench etch processes may be carried out in-situ in a same processing module. In some embodiments where the upper hard mask layer (e.g., layer 503) were not previously removed, the organic based upper mask layer can be removed by applying O2 based plasma following the lower trench formation process.

Figure 10:
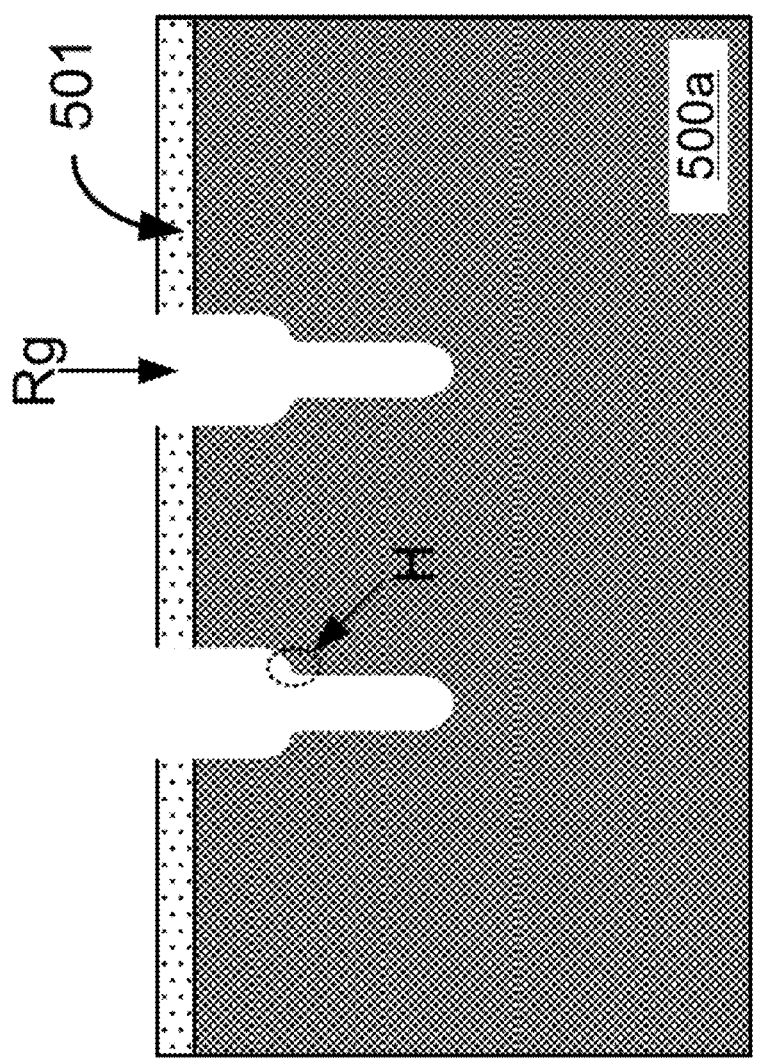

FIG. 10 shows a removal/cleaning process for the remaining portion of the trench liner (e.g., spacer 801) over the lateral surface that defines the gate trench feature Rg. In some embodiments, liner removal may be carried out by dry or wet clean process with F-based gas chemistry, or conventional wet chemicals with sufficient selectivity with respect to Si material of the active region 500a. Upon removal of the spacer liner (e.g., 801), the pitch separation difference discussed above reflects in the generation of a shoulder profile H. In some embodiments, the shoulder profile H comprises a sloped yet generally continuous sidewall curve that defines a reduced trench width toward the bottom of the gate trench feature Rg.

Figure 11:
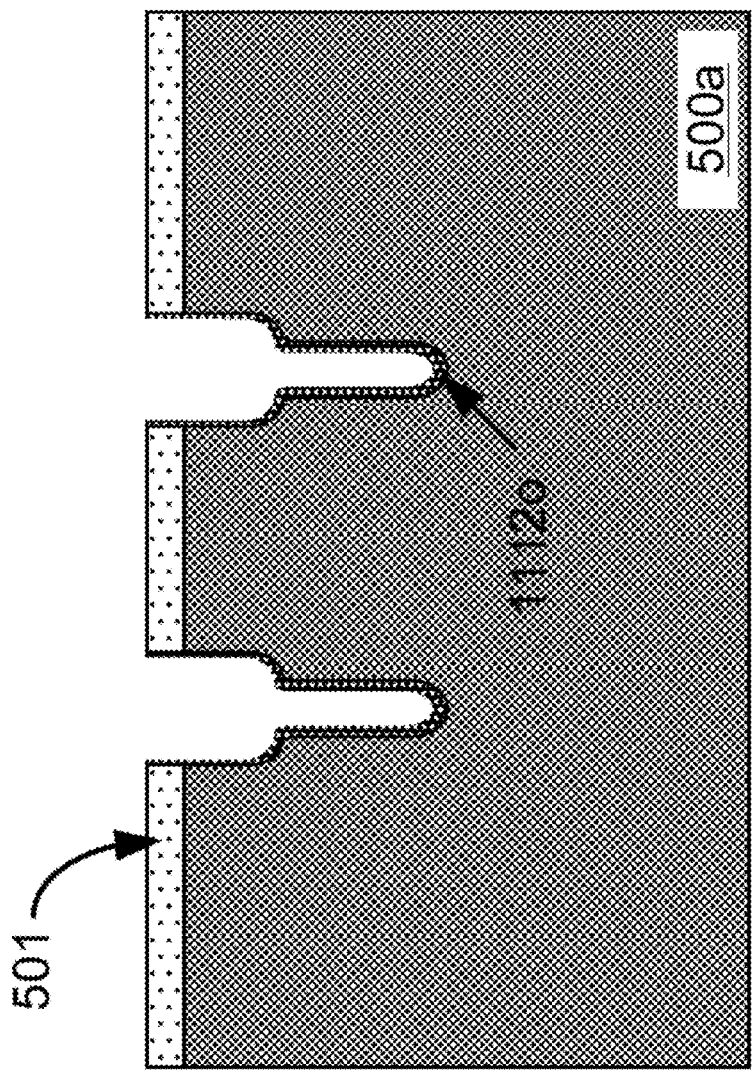

FIG. 11 shows a gate dielectric formation deposition process. In some embodiments, the gate dielectric comprises substantially oxide material. In some embodiments, gate oxide growth by may carried out through diffusion process with material such as SiON, SiO2, HfOx, etc. In some embodiments, the dielectric liner 1112o extends upward and reaches the top boundary of the active region 500a. In some embodiments, the dielectric liner 1112o covers the sidewall portion of the lower hard mask layer 501 as well.

Figure 12:
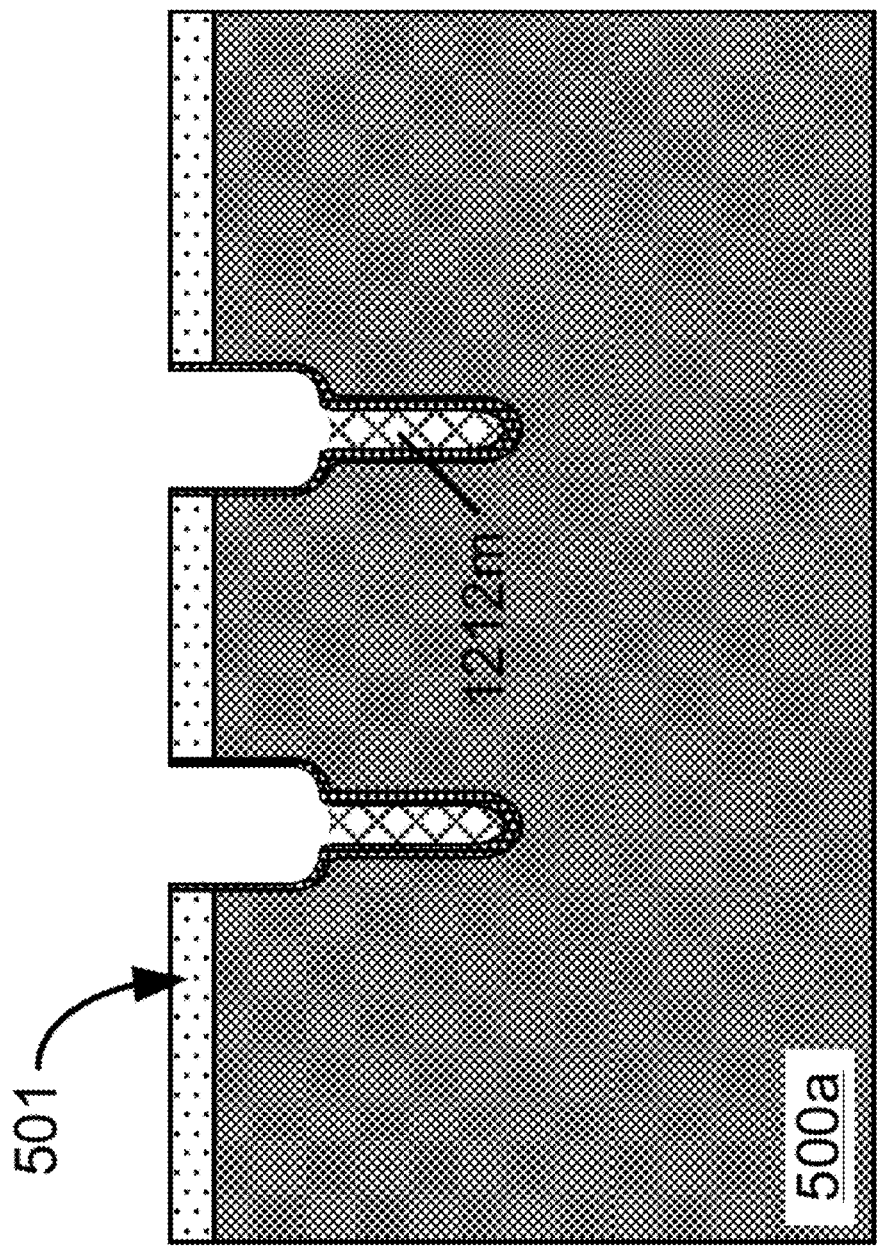

FIG. 12 shows a gate metal deposition process. During this process, a conductive feature 1212m is formed in the second recessed feature (e.g., R21 as previously depicted) over the dielectric liner (e.g., liner 1112o). In some embodiments, the gate metal deposition may employ ALD or CVD techniques, with barrier metal (such as TiN, TaN, or WNx, etc) being conformally disposed on the exposed surface of the liner 1112o, then followed by a gate metal deposition of conductive material such as W, Co, Ru, etc. In some embodiments, the gate metal material may be disposed to fully fill the respective gate trench features.

Following the gate metal deposition, gate metal planarization and metal etch back processes are performed. The planarization process may include a chemical mechanical polishing (CMP) operation to recess the metal surface until the re-exposure of the lower hard mask layer 501. Subsequently, a dry etch back process may be performed to recess the top boundary of the gate metal material down to the lower portion of the gate trench (e.g., R21/R22). In some embodiments, the upper boundary of the conductive feature 1212m is pushed to a level that is not higher than the shoulder portion (e.g., shoulder profile H). Accordingly, the conductive feature 1212m possesses a width not wider than an average width of the lower portion of the gate trench feature (e.g., width W1 as shown in FIG. 4).

In some embodiments, F-based chemistry such as NF3, SF6 can be used to provide high selectivity to barrier liner material, while the gate metal filler material etch back can be done by an etchant that is selective to gate oxide, e.g., Cl2 based chemistry. In some embodiments, during the metal etch back process, a thickness of an upper portion of the dielectric liner 1112o may be reduced (as compared to the thickness thereof in the lower part of gate trench, which surrounds the conductive feature 1212m).

Figure 13:
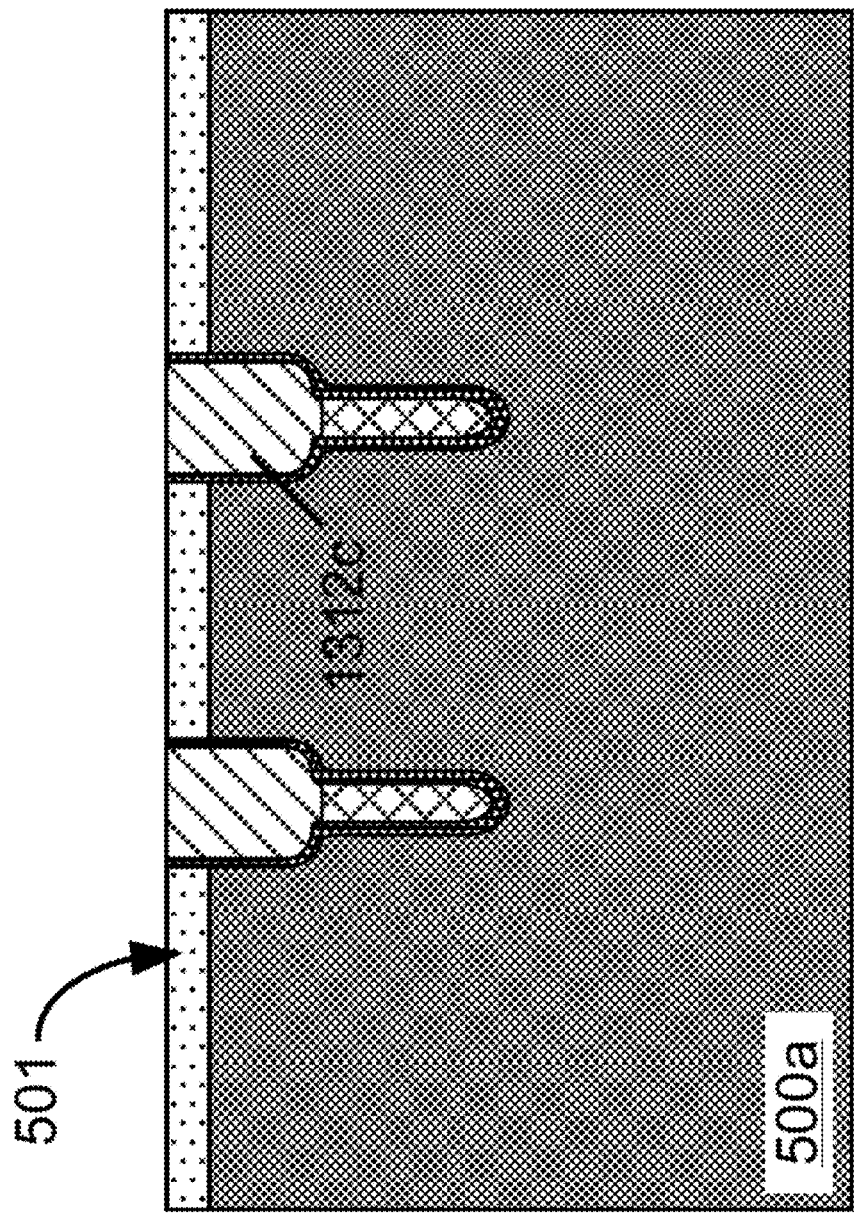

FIG. 13 shows a cap formation process, in which a dielectric filling and etch back operations are performed to ensure gate isolation from active region or subsequently formed interconnect structure. In the cap formation process, an insulating cap 1312c is formed by disposing a dielectric material over the conductive feature (e.g., gate metal 1212m), and perform an etch back operation thereto. In some embodiments, the etch back operation includes a CMP process that generates an upper cap surface that is substantially coplanar with a top surface of the hard mask layer 501. In some embodiments, the etch back operation further removes the hard mask layer, thereby generating an upper cap surface that is substantially coplanar to a top boundary of the active region 501a.

Accordingly, one aspect of the instant disclosure provides a semiconductor device, which comprises: an active region over a substrate defining a top surface; and a gate structure embedded in the active region. In a cross section of the active region, the gate structure comprises: a conductive feature having a first width buried in the active region and reaching a first depth therein, an insulating cap having a second width arranged above the conductive feature in the active region and reaching a second depth therein; and a dielectric liner arranged between the active region and the conductive feature. The first width is smaller than the second width.

In some embodiments, a ratio of the second depth to the first depth ranges from about 0.25 to about 0.67.

In some embodiments, a ratio of the first width to the second width ranges from about 0.5 to 0.9.

In some embodiments, the insulating cap includes a shoulder portion proximate the conductive feature.

In some embodiments, the conductive feature is arranged not higher than the shoulder portion of the insulating cap.

In some embodiments, the shoulder portion of the insulating cap includes a sloped profile with reduced width toward the conductive feature.

In some embodiments, the dielectric liner extends upward between the insulating cap and the active region.

In some embodiments, the portion of the dielectric liner between the insulating cap and the active region has a lower thickness than the portion between the conductive feature and the active region.

Accordingly, another aspect of the instant disclosure provides a semiconductor structure, which comprises: an active region formed over a substrate having an stripe planar profile, the active region defining a top surface; and a control line structure intercepting the active region at an oblique angle. The control line structure includes: a conductive line having a first width crossing through a lower portion of the active region and reaching a first depth under the top surface of the active region; an insulating cap having a second width arranged above the conductive line and reaching a second depth under the active region; a dielectric liner interposing between the control line structure and active region. The first width is smaller than the second width.

In some embodiments, the oblique angle between the active region and the control line structure ranges from 65 to about 75 degrees.

In some embodiments, a ratio of the second depth to the first depth ranges from about 0.25 to about 0.67.

In some embodiments, a ratio of the second width to the first width ranges from about 0.5 to about 0.9.

In some embodiments, the insulating cap defines a shoulder portion proximate the conductive line.

In some embodiments, the conductive line is arranged below the shoulder portion of the insulating cap.

In some embodiments, the shoulder portion of the insulating cap includes a sloped profile with reduced width toward the conductive line.

In some embodiments, the dielectric liner extends upward between the insulating cap and the active region.

In some embodiments, the portion of the dielectric liner between the insulating cap and the active region has a lower thickness than the portion between the conductive line and the active region.

Accordingly, yet another aspect of the instant disclosure provides a method of fabricating semiconductor structure, which comprises: forming an active region having a strip planar profile over an substrate; performing a first etching operation to form a first recessed feature having a first width, the first recess intercepting the active region and reaching a first depth; disposing a liner substantially conformally over exposed lateral and bottom surfaces of the first recessed feature; forming a second recessed feature having a second width and reaching a second depth in the active region; and removing the remaining portion of the liner over the lateral surface.

In some embodiments, the forming of a second recessed feature comprises: performing a second etching operation through the portion of the liner on the bottom surface while retaining the portion of the liner over the lateral surface of the first recessed feature.

In some embodiments, the method further comprises: disposing an dielectric liner over exposed surfaces of the second recessed feature.

In some embodiments, the method further comprises: forming a conductive feature in the second recessed feature over the dielectric liner.

In some embodiments, the method further comprises: forming an insulating cap over the conductive feature.

In some embodiments, the forming of conductive feature in the second recessed feature includes: filling exposed portions of the first and the second recessed features with a conductive material, and performing an etching back operation to the conductive material to form the conductive feature in the active region at a depth level substantially equal to or deeper than the first depth.

In some embodiments, the forming of insulating cap comprises disposing a dielectric material over the conductive feature, and forming an insulating cap substantially coplanar with a top surface of the active region.

The embodiments shown and described above are only examples. Many details are often found in the art such as the other features of a logistics data management method. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A semiconductor structure, comprising:
   an active region formed over a substrate having a stripe planar profile, the active region comprising a top surface; and
   a control line structure intercepting the active region at an oblique angle, the control line structure comprising:
      a conductive line having a first width crossing through a lower portion of the active region and reaching a first depth under the top surface of the active region;
      an insulating cap having a second width arranged above the conductive line and reaching a second depth under the top surface of the active region; and
      a dielectric liner interposing between the control line structure and the active region;
   wherein the first-width is smaller than the second width.

2. The structure of claim 1, wherein: the oblique angle between the active region and the control line structure ranges from 65 to about 75 degrees.

3. The structure of claim 1, wherein: a ratio of the second depth to the first depth ranges from about 0.25 to about 0.67.

4. The structure of claim 1, wherein: a ratio of the second depth to the first depth ranges from about 0.5 to about 0.9.

5. The structure of claim 1, wherein: the insulating cap defines a shoulder portion proximate the conductive line, the conductive line is arranged below the shoulder portion of the insulating cap.

6. The structure of claim 5, wherein: the shoulder portion of the insulating cap includes a sloped profile with width reducing toward the conductive line.

7. The structure of claim 1, wherein: the dielectric liner extends upward between the insulating cap and the active region.

8. The structure of claim 7, wherein: the portion of the dielectric liner between the insulating cap and the active region has a lower thickness than the portion between the conductive line and the active region.

* * * * *